United States Patent
Huang

(10) Patent No.: US 11,119,173 B2
(45) Date of Patent: Sep. 14, 2021

(54) DYNAMIC IMAGING BASED ON ECHO PLANAR IMAGING SEQUENCE

(71) Applicant: Neusoft Medical Systems Co., Ltd., Liaoning (CN)

(72) Inventor: Feng Huang, Shanghai (CN)

(73) Assignee: Neusoft Medical Systems Co., Ltd., Liaoning (CN)

( * ) Notice: Subject to any disclaimer, the term of this patent is extended or adjusted under 35 U.S.C. 154(b) by 250 days.

(21) Appl. No.: 16/575,649

(22) Filed: Sep. 19, 2019

(65) Prior Publication Data

US 2020/0096590 A1    Mar. 26, 2020

(30) Foreign Application Priority Data

Sep. 20, 2018 (CN) .......................... 201811102474.1

(51) Int. Cl.
| | | |
|---|---|---|
| *G01R 33/50* | (2006.01) | |
| *G01R 33/561* | (2006.01) | |
| *G01R 33/563* | (2006.01) | |

(52) U.S. Cl.
CPC ..... *G01R 33/5615* (2013.01); *G01R 33/5619* (2013.01); *G01R 33/56308* (2013.01)

(58) Field of Classification Search
CPC .............. G01R 33/543; G01R 33/5608; G01R 33/5607; G01R 33/4828; G01R 33/4835;
(Continued)

(56) References Cited

U.S. PATENT DOCUMENTS

2013/0099784 A1*  4/2013  Setsompop ........ G01R 33/4826
                                                      324/309
2016/0202338 A1*  7/2016  Kimura ............ G01R 33/56341
                                                      324/309
(Continued)

FOREIGN PATENT DOCUMENTS

| CN | 102859386 A | 1/2013 |
|---|---|---|
| CN | 106997034 A | 8/2017 |

(Continued)

OTHER PUBLICATIONS

CN Office Action in Chinese Appln. No. 201811102474.1, dated Jul. 21, 2020, 13 pages (with English Translation).
(Continued)

*Primary Examiner* — Jermele M Hollington
*Assistant Examiner* — Taqi R Nasir
(74) *Attorney, Agent, or Firm* — Fish & Richardson P.C.

(57) ABSTRACT

Methods, devices, systems and apparatus for dynamic imaging based on echo planar imaging (EPI) sequence are provided. In one aspect, a method includes: obtaining first pre-scanned k-space data by performing a pre-scan for a subject based on a first EPI sequence and pre-scanning parameters, obtaining a pre-scanned image and second pre-scanned k-space data according to the first pre-scanned k-space data, performing a dynamic scan for the subject based on a second EPI sequence and dynamic scanning parameters to generate dynamically-scanned k-space data associated with each of a plurality of dynamic periods in the dynamic scan, and for each of the dynamic periods, generating a residual image according to the dynamically-scanned k-space data of the dynamic period and the second pre-scanned k-space data, and adding the pre-scanned image and the residual image to obtain a dynamic image of the dynamic period.

20 Claims, 3 Drawing Sheets

(58) Field of Classification Search
CPC ............. G01R 33/3415; G01R 33/283; G01R 33/307; G01R 33/60; G01R 33/50; G01R 33/5615; G01R 33/5619; G01R 33/56308; G01V 3/32; E21B 49/08; E21B 2049/085; G01N 24/10
See application file for complete search history.

(56) References Cited

U.S. PATENT DOCUMENTS

2017/0108571 A1* 4/2017 Jurrissen .......... G01R 33/56554
2017/0242089 A1* 8/2017 Kiefer ................ G01R 33/5616

FOREIGN PATENT DOCUMENTS

| CN | 107037386 A | 8/2017 |
| CN | 107576924 A | 1/2018 |
| CN | 107607895 A | 1/2018 |
| CN | 108287324 A | 7/2018 |
| JP | 2001-170025 A | 6/2001 |

OTHER PUBLICATIONS

Huang, Feng, et al., "k-t GRAPPA: A k-space Implementation for Dynamic MRI with High Reduction Factor," Magnetic Resonance in Medicine 54:1172-1184 (2005).

Chen, Nan-kuei, et al., "A Robust Multi-Shot Scan Strategy for High-Resolution Diffusion Weighted MRI Enabled by Multiplexed Sensitivity-Encoding (MUSE)," NeuroImage 72:41-47 (2013).

* cited by examiner

DYNAMIC IMAGING BASED ON ECHO PLANAR IMAGING SEQUENCE

CROSS REFERENCE TO RELATED APPLICATIONS

This application claims priority to Chinese Patent Application No. 201811102474.1 filed on Sep. 20, 2018, the entire content of which is incorporated herein by reference.

BACKGROUND

Magnetic Resonance Imaging (MRI) is one of the main imaging methods in modern medical imageology. MRI may be performed based on the following basic principle: hydrogen protons in a human body are excited by a radio-frequency excitation based on a magnetic resonance phenomenon, position encoding is performed with gradient magnetic fields, and signals with position information are then received by using a receiving coil, and a magnetic resonance image of a subject is finally reconstructed. However, due to limitation of the position encoding, it may take a long scanning time for magnetic resonance imaging.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, devices, systems and apparatus for dynamic imaging based on echo planar imaging (EPI) sequence.

In general, one innovative aspect of the subject matter described in this specification can be embodied in methods that include the actions of dynamic imaging based on an Echo Planar Imaging (EPI) sequence, including: obtaining first pre-scanned k-space data by performing at least one pre-scan for a subject based on a first EPI sequence and pre-scanning parameters, the first EPI sequence including a plurality of excitations; obtaining a pre-scanned image and second pre-scanned k-space data according to the first pre-scanned k-space data; performing a dynamic scan for the subject based on a second EPI sequence and dynamic scanning parameters to generate dynamically-scanned k-space data associated with each of a plurality of dynamic periods in the dynamic scan, where the dynamic scanning parameters are same as the pre-scanning parameters, the dynamically-scanned k-space data of the dynamic period includes multi-channel down-sampled k-space data obtained through at least one excitation of the dynamic period, and a sampling trajectory of the at least one excitation of the dynamic period is same as a sampling trajectory of at least one excitation of the at least one pre-scan; and for each of the plurality of dynamic periods, generating a residual image of the dynamic period according to the dynamically-scanned k-space data of the dynamic period and the second pre-scanned k-space data, and adding the pre-scanned image and the residual image of the dynamic period to obtain a dynamic image of the dynamic period.

Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. For example, generating a residual image of the dynamic period according to the dynamically-scanned k-space data of the dynamic period and the second pre-scanned k-space data can include: subtracting the second pre-scanned k-space data from the dynamically-scanned k-space data of the dynamic period to obtain residual k-space data of the dynamic period; and generating the residual image of the dynamic period according to the residual k-space data of the dynamic period.

In some implementations, generating the residual image of the dynamic period according to the residual k-space data of the dynamic period includes: generating the residual image of the dynamic period by performing parallel reconstruction of sparsity constraint for the residual k-space data of the dynamic period.

In some implementations, generating the residual image of the dynamic period by performing parallel reconstruction of sparsity constraint for the residual k-space data of the dynamic period includes: obtaining a corresponding residual image when a target function reaches a minimum value and taking the corresponding residual image as the residual image of the dynamic period, and the target function can be expressed as below:

$$f(rI_t) = \sum_{j=1}^{J} \|E(rI_t) - rk_j^t\|^2 + \alpha \|rI_t\|^2,$$

where $f(rI_t)$ refers to the target function of the t-th dynamic period, and t is a positive integer;

J refers to a channel number of a coil and is a positive integer;

j is a positive integer and $j \in \{1, 2, \ldots, J\}$;

$rI_t$ refers to a to-be-solved residual image of the t-th dynamic period;

$E(rI_t)$ refers to k-space data corresponding to the to-be-solved residual image $rI_t$ of the t-th dynamic period;

$rk_j^t$ refers to the residual k-space data of the t-th dynamic period associated with the j-th channel;

$\| \|^2$ refers to an L2 norm; and

α is a regularization factor.

In some examples, generating the residual image of the dynamic period according to the residual k-space data of the dynamic period includes: reconstructing the residual image of the dynamic period by using the residual k-space data of adjacent dynamic periods that include one or more dynamic periods respectively before and after the dynamic period. Reconstructing the residual image of the dynamic period can include: reconstructing the residual image of the dynamic period by direct data sharing or k-t generalized auto-calibrating partially parallel acquisition (GRAPPA) parallel reconstruction.

The sampling trajectory of the at least one excitation of the first EPI sequence can include one of: a multi-segment sampling trajectory in a direction of k-space readout gradient, a cross phase encoding line sampling trajectory in a direction of k-space phase encoding, and a spiral trajectory.

In some examples, the second EPI sequence are the same as the first EPI sequence and includes a plurality of excitations same as the plurality of excitations of the first EPI sequence, and the dynamically-scanned k-space data of each of the dynamic periods includes k-space data respectively collected during each RF excitation process of the plurality of excitations of the second EPI sequence.

In some examples, the second EPI sequence are the same as the first EPI sequence and includes a plurality of excitations same as the plurality of excitations of the first EPI sequence, and the dynamically-scanned k-space data of each of the dynamic periods includes k-space data respectively collected during one or more excitation processes of the plurality of excitations of the second EPI sequence, a number of the one or more excitation processes for the collected k-space data being smaller than a number of the plurality of excitations.

In some examples, the second EPI sequence includes a single excitation in the first EPI sequence.

In some implementations, obtaining the pre-scanned image and the second pre-scanned k-space data according to the first pre-scanned k-space data includes: generating the pre-scanned image by performing image reconstruction for the first pre-scanned k-space data; and obtaining the second pre-scanned k-space data by mapping the pre-scanned image to a k-space.

In some examples, generating the pre-scanned image by performing image reconstruction for the first pre-scanned k-space data includes: generating the pre-scanned image by performing image reconstruction for the first pre-scanned k-space data based on a multiplexed sensitivity-encoding algorithm.

In some examples, obtaining the second pre-scanned k-space data by mapping the pre-scanned image to the k-space includes: for each of multiple channels corresponding to a multi-channel coil, multiplying the pre-scanned image by a coil sensitivity map of the channel to obtain a to-be-processed image of the channel; and obtaining the second pre-scanned k-spaced data by performing inverse Fourier Transform for the to-be-processed images of the multiple channels.

In some implementations, obtaining the pre-scanned image and the second pre-scanned k-space data according to the first pre-scanned k-space data includes: generating the pre-scanned image by performing image reconstruction for the first pre-scanned k-space data; and obtaining the second pre-scanned k-space data by performing interpolation processing for the first pre-scanned k-space data.

In some implementations, the action further include: arranging the dynamic images of the plurality of dynamic periods in the dynamic scan along a time dimension to indicate a situation of changes in a component of the subject.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

An Echo Planar Imaging (EPI) sequence features a high scanning speed, and can be used to perform a scan in applications with high temporal resolution requirements. The EPI sequence is different from a conventional gradient echo sequence, where a plurality of gradient echoes are generated during continuous positive and negative switching of readout gradients after a Radio Frequency (RF) pulse excitation is applied.

Figure 1A:
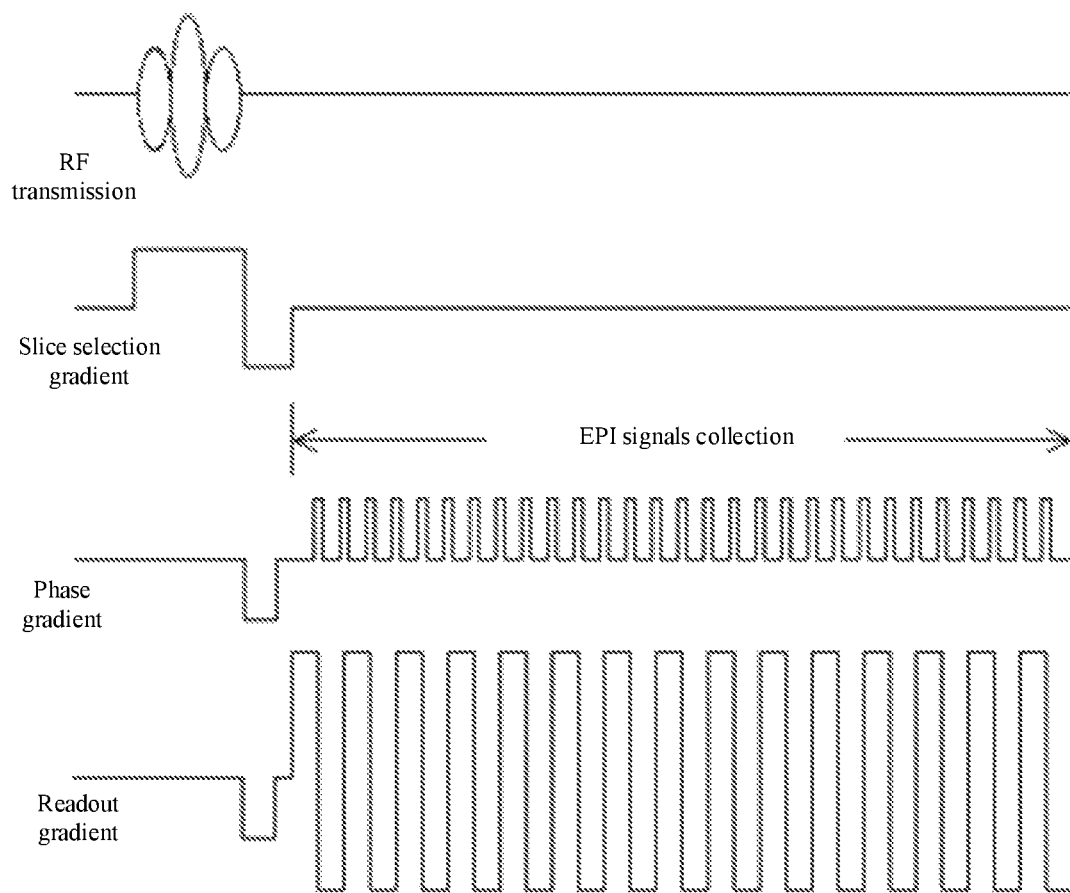
FIG. 1A is a schematic diagram illustrating an EPI sequence.
Figure 1B:
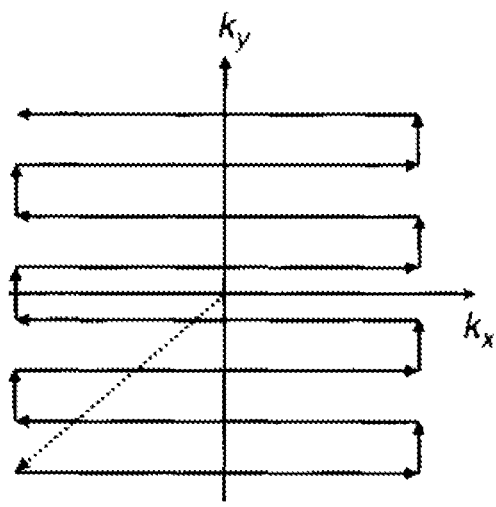
FIG. 1B is a schematic diagram illustrating a k-space filling manner of an EPI sequence.

FIG. 1A is a schematic diagram illustrating an EPI sequence. An abscissa of FIG. 1A refers to time. As shown in FIG. 1A, after a RF pulse is transmitted and a slice selection gradient is set, the readout gradient rapidly oscillates between a positive amplitude and a negative amplitude to form a series of gradient echoes. If different phase codes are applied to these gradient echoes respectively, data of an entire k-space may be collected by one or more RF excitations. As shown in FIG. 1B, each oscillation of the readout gradient corresponds to one row of data in the k-space, and a frequency encoding kx is performed for each piece of data in a row of the k-space data. Different rows of the k-space data correspond to different phase encoding ky respectively. Since a plurality of echoes of the EPI sequence are generated by the continuous positive and negative switching of readout gradients, filling the generated signals within the k-space is a roundabout trajectory. EPI raw data obtained by scanning based on the EPI sequence is included in n (n is a positive integer) rows of k-space data. For simplicity, the k-space data collected by a positive gradient is referred to as an even echo (corresponding to an even row of data in the k-space), and the k-space data collected by a negative gradient is referred to as an odd echo (corresponding to an odd row of data in the k-space).

It can be known from the above that the EPI sequence features a high scanning speed. However, rapid switching between the positive gradient and the negative gradient may generate a large eddy current and a phase difference may be generated between the even and odd rows of data in the k-space generated by the EPI sequence due to inhomogeneity of a main magnetic field. Thus, image quality problems of low image signal-to-noise ratio and image distortion exist in the EPI sequence.

To solve the problem of the low image signal-to-noise ratio, it may be required to collect k-space data multiple times for averaging. To solve the problem of the image distortion, the collections with a plurality of excitations may be required. These methods of improving image quality may all prolong scanning time, reduce a temporal resolution, and especially affect a dynamic scan.

To reduce the image distortion without prolonging dynamic scan time, accelerated image scanning technologies, such as a parallel imaging technology, a multi-slice excitation parallel imaging technology and a compressed sensing technology, may be used. The parallel imaging technology may reduce the image distortion without prolonging the scanning time, but may further increase an image noise. The multi-slice excitation parallel imaging technology may reduce the image distortion without prolonging the scanning time and significantly changing the signal-to-noise ratio, but may impose a higher requirement for hardware including a RF receiving coil and a RF amplifier. The compressed sensing technology, especially a time-dimension compressed sensing technology, may improve the signal-to-noise ratio and reduce the image distortion, but may have a risk of decreasing image sharpness due to a signal loss. These accelerated image scanning methods may bring some negative impacts, such as increased noise, high hardware requirements and low image sharpness resulting from signal loss.

Implementations of the present disclosure provide a dynamic imaging method based on an EPI sequence, which can improve the image signal-to-noise ratio and reduce the image distortion without prolonging the dynamic scan time while no hardware of high requirements is configured and no image sharpness is decreased. The method may be realized based on a high-quality pre-scanned image that may be obtained by performing a pre-scan for a subject before a dynamic scan is performed.

A dynamic scan refers to a scan where a series of dynamic images are obtained by performing continuous and repeated sub-scans for the subject. The series of dynamic images may reflect some particular physiological characteristics of tissues, such as tumours and blood vessels, of the subject. A dynamic scanning method can be used in applications that may require continuous tracking of tissues, such as brain functions, dynamic enhanced imaging, arterial spin labelling, and so on.

A dynamic period refers to a time period where one or more excitation processes are performed to form a dynamic image. A dynamic scan can include one or more dynamic periods.

A pre-scan refers to a scan performed before a formal scan, e.g., a dynamic scan. Operations such as image correction and image quality improvement may be performed for reconstructed images obtained through the formal scan by using a reconstructed image obtained through the pre-scan.

A temporal resolution refers to time required for obtaining a complete image by scanning. The shorter the scanning time is, the higher the temporal resolution is.

A high-quality pre-scanned image may be obtained by performing a pre-scan for a subject long before a dynamic scan for the following reasons: in the dynamic scan, the temporal resolution is a very important parameter, and a higher temporal resolution means that a more accurate analysis is performed based on continuous images. The pre-scan is independent of the dynamic scan, and the temporal resolution of the pre-scan does not affect the temporal resolution of the dynamic scan. Therefore, a pre-scanned image with a high signal-to-noise ratio may be obtained through the pre-scan, and the temporal resolution of dynamic scan images is not affected.

To increase a spatial resolution of an image, an EPI sequence adopted in the pre-scan may be a multi-excitation EPI sequence, where signals corresponding to different regions of the k-space may be collected during a respective excitation process. Signals collected during all excitation process in the multi-excitation EPI sequence may form the entire k-space data. The entire k-space data may be used to reconstruct a magnetic resonance image. The respective excitation processes can be sequentially performed. The sequentially-performed excitation processes can be repeatedly performed in the EPI sequence. Therefore, the k-space data associated with multi-excitation may form complete k-space data, so that a reconstructed image can have a high spatial resolution. Moreover, a plurality of pre-scans may also be performed for the subject based on the multi-excitation EPI sequence, and then, data obtained through the plurality of pre-scans can be averaged. Image reconstruction using the averaged pre-scanned data can reduce the image noise and improve the signal-to-noise ratio of the image.

In some implementations, the pre-scan is performed for the subject before the dynamic scan, and then a pre-scanned image or a group of pre-scanned images with high signal-to-noise ratios are obtained by performing image reconstruction for the k-space data obtained through the pre-scan.

For the same subject, the pre-scanned image has a high similarity with a dynamic image of a dynamic period, thus a common part exists therebetween. It is assumed that the pre-scanned image represents common information of this part. Thus, the dynamic image of the dynamic period may be divided into a common part and a different part. The different part between the pre-scanned image and the dynamic image of each dynamic period is represented by residual k-space data between dynamically-scanned k-space data of the dynamic period and pre-scanned k-space data. For the residual k-space data of the dynamic period, a residual image of the dynamic period may be reconstructed by using the residual k-space data in combination with a parallel reconstruction method of sparsity constraint.

Finally, a total image, that is, the dynamic image of the dynamic period, is obtained by adding the residual image of the dynamic period and the pre-scanned image. The high-quality pre-scanned image and the residual image constitute a dynamic image. Therefore, the obtained dynamic image can have a high quality. Further, the scan of the high-quality pre-scanned image does not take the dynamic scan time.

A dynamic image of a dynamic period refers to a multi-slice 2D (two-dimensional) or 3D (three-dimensional) image obtained by performing a scan within a unit time, and is a unit image during a continuous scan. Situation of changes in an interested tissue within a particular period of time may be obtained by arranging a plurality of unit images along a time dimension. A doctor may make a decision with the help of different situations of changes in the tissue.

In some implementations, the dynamic imaging method based on an EPI sequence can include: obtaining first pre-scanned k-space data by performing at least one pre-scan for a subject based on a first EPI sequence and pre-scanning parameters, where the first EPI sequence is a multi-excitation EPI sequence; generating dynamically-scanned k-space data of each dynamic period by performing a dynamic scan for the subject based on a second EPI sequence and dynamic scanning parameters, where the dynamically-scanned k-space data of each dynamic period is multi-channel down-sampled k-space data of at least one excitation, the pre-scanning parameters are same as the dynamic scanning parameters, and a sampling trajectory of the dynamically-scanned k-space data of each dynamic period is same as a sampling trajectory of the at least one excitation in the first pre-scan k-space data; obtaining a pre-scanned image and second pre-scanned k-space data according to the first pre-scanned k-space data; for each dynamic period, generating a residual image of the dynamic period according to the dynamically-scanned k-space data of the dynamic period and the second pre-scanned k-space data; and for each dynamic period, obtaining a total image as the dynamic image of the dynamic period by adding the residual image of the dynamic period and the pre-scanned image.

In some implementations, in the dynamic imaging method based on an EPI sequence, the dynamic image of each dynamic period is obtained by adding the pre-scanned image and the residual image of each dynamic period. The pre-scanned image is obtained by reconstructing multi-excitation data obtained through at least one pre-scan. The image obtained by reconstructing the multi-excitation data has high image quality, such as a high image resolution and/or a high image signal-to-noise ratio. Further, the residual image is a sparse image obtained by performing parallel reconstruction with the pre-scanned k-space data as a constraint term. Therefore, the sparse image has a better image reconstruction result, such as fewer artifacts. Thus, the total dynamic image obtained by adding the high-quality pre-scanned image and the residual image of each dynamic period can also have high image quality. In addition, the dynamically-scanned k-space data of each dynamic period is data obtained through at least one excitation. Therefore, the collection of the dynamically-scanned k-space data for each dynamic period is equivalent to a collection with a high parallel imaging factor (e.g., a high down-sampling multiple), and each dynamic image has a small distortion. Further, in a traditional single excitation method a plurality of collecting the k-space data and averaging is required. Here, according to the present disclosure, the data obtained through one excitation can be taken as the dynamically-scanned k-space data of one dynamic period. Moreover, the scanning time of each dynamic period may be further shortened compared with the traditional single excitation method. Therefore, technologies implemented in the present disclosure can realize effects of increasing the signal-to-noise ratio of an image and reducing the image distortion without prolonging the scanning time.

Further, the technologies do not require upgrading the configurations of the RF receiving coil and the RF amplifier, and the hardware requirement is not increased. In addition, the signal loss of the dynamic scan can be reduced by using the pre-scanned k-space data. Therefore, the decrease of the image sharpness can be reduced.

Specific examples of the present disclosure will be described in detail below in combination with accompanying drawings.

Figure 2:
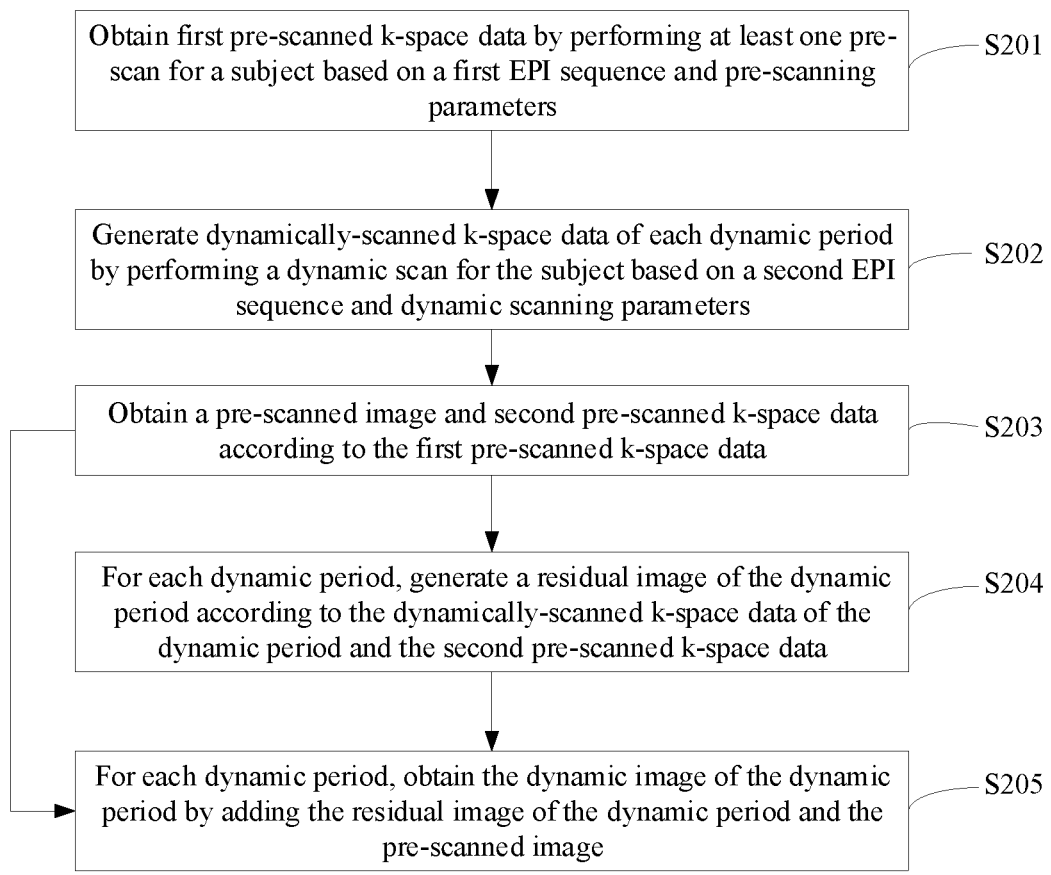
FIG. 2 is a flowchart of a process illustrating a dynamic scanning method based on an EPI sequence according to an example of the present disclosure.

FIG. 2 shows a process of a dynamic imaging method based on an EPI sequence according to an example of the present disclosure. The process can include the following steps.

At step S201, first pre-scanned k-space data is obtained by performing at least one pre-scan for a subject based on a first EPI sequence and pre-scanning parameters.

In an example of the present disclosure, the first EPI sequence is a multi-excitation EPI sequence. A pre-scanning process can include a plurality of excitation processes.

The pre-scanning parameters may include repetition time (TR), echo time (TE), echo spacing (ES), a field of view, a spatial resolution, and the like.

Specifically, step S201 can be described as follows: a multi-channel coil of an MRI system performs at least one pre-scan for a subject based on the first EPI sequence and the pre-scanning parameters, and signals are collected through the multi-channel coil during each RF excitation process, thereby obtaining the first pre-scanned k-space data.

When there is a pre-scan, the first pre-scanned k-space data is multi-channel k-space data collected during a plurality of excitation processes within the pre-scan.

During each RF excitation process, data corresponding to different k-space regions may be collected, so that signals collected during the plurality of excitation processes form complete k-space data, thereby improving the quality of a pre-scanned image.

When there are multiple pre-scans, for example, two or more pre-scans, the first pre-scanned k-space data is multi-channel k-space data obtained by averaging multiple collected multi-channel k-space data.

The noise may be reduced by averaging multiple collections, which can further increase the signal-to-noise ratio of a pre-scanned image. The spatial resolution of the pre-scanned image may be improved by performing a plurality of excitations for the subject based on the multi-excitation EPI sequence.

The sampling trajectory of the pre-scan is not limited in the example of the present disclosure, and therefore may be any form of sampling trajectory. In an example, the sampling trajectory of the first pre-scanned k-space may be a multi-segment sampling trajectory in a direction of k-space readout gradient, a cross phase encoding line sampling trajectory in a direction of k-space phase encoding, or a spiral trajectory.

In an example of the present disclosure, when signals of each excitation are collected, signals corresponding to different k-space regions may be collected by setting gradient coils. These signals obtained in different excitation processes are combined together to form complete k-space data, and a pre-scanned image with a high signal-to-noise ratio is finally reconstructed by the complete k-space data.

To understand specific implementations of step S201 more clearly, the specific implementations of step S201 can be illustrated by way of examples below.

Assuming that the first EPI sequence is a four-excitation EPI sequence, that is, four excitations are performed for the subject based on the first EPI sequence during the pre-scan.

Figure 3:
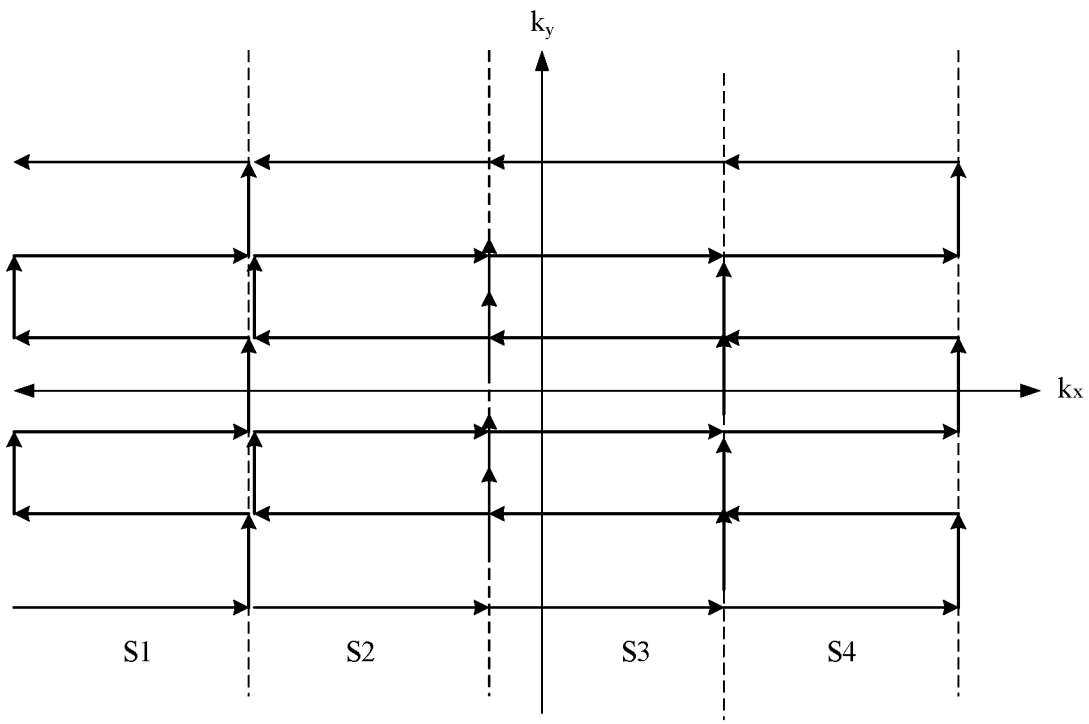
FIG. 3 is a schematic diagram illustrating a sampling trajectory according to an example of the present disclosure.

In an example, the multi-segment sampling trajectory in the direction of k-space readout gradient may be shown in FIG. 3, where kx refers to the readout gradient direction (that is the frequency encoding direction), and ky refers to the phase encoding direction. As shown in FIG. 3, the k-space is divided into four segments, e.g., S1 to S4, in the direction of the readout gradient. In this example, the sampling trajectory of the first pre-scanned k-space is as follows: in a first excitation process, signals associated with a first segment S1 of the k-space are collected; in a second excitation process, signals associated with a second segment S2 of the k-space are collected; in a third excitation process, signals associated with a third segment S3 of the k-space are collected; in a fourth excitation process, signals associated with a fourth segment S4 of the k-space are collected.

In another example, the k-space may include 96 rows of phase encoding lines. In this case, the sampling trajectory of cross phase encoding lines in the direction of k-space phase encoding may specifically be as follows: in the first excitation process, signals on the 1st, 5th, 9th, . . . , and 4n+1-th rows of phase encoding lines are collected; in the second excitation process, signals on the 2nd, 6th, 10th, . . . , and 4n+2-th rows of phase encoding lines are collected; in the third excitation process, signals on the 3rd, 7th, 11th, . . . , and 4n+3-th rows of phase encoding lines are collected; and in the fourth excitation process, signals on the 4th, 8th, 12th, . . . , and 4n+4-th rows of phase encoding lines are collected, where n is an integer. Thus, the signals of four excitation processes are collected in the above sampling manners and these signals may be combined together to form the complete k-space data.

At step S202, dynamically-scanned k-space data associated with each of a plurality of dynamic periods is generated by performing a dynamic scan for the subject based on a second EPI sequence and dynamic scanning parameters.

The dynamically-scanned k-space data of each dynamic period can be multi-channel down-sampled k-space data with at least one excitation at this step. The multi-channel k-space data is data collected by a multi-channel coil, for example, array coils. To shorten the scanning time in which the dynamically-scanned k-space data associated with each dynamic period is collected, a down-sample manner is used. That is, compared to the acquisition of entire k-space data in a full sample manner, in the down-sample manner only a part of k-space data is collected at each dynamic period.

In an example, the second EPI sequence may be a multi-excitation EPI sequence. In this example, the second EPI sequence and the first EPI sequence may be the same EPI sequence.

When the second EPI sequence is the multi-excitation EPI sequence, step S202 may include: performing a dynamic scan for the subject based on the second EPI sequence and the dynamic scanning parameters, where the dynamic scan may include one or more second EPI sequences; collecting signals during each RF excitation process of each of the second EPI sequences; and taking the signals collected during at least one excitation process as the dynamically-scanned k-space data of the dynamic period.

In another example, the second EPI sequence may be a single-excitation EPI sequence. In this example, the sampling trajectory of the single-excitation EPI sequence is same as the sampling trajectory of the first EPI sequence in a particular excitation process.

When the second EPI sequence is the single-excitation EPI sequence, step S202 may include: performing a dynamic scan for the subject based on the single-excitation EPI sequence and the dynamic scanning parameters, where the dynamic scan may include a plurality of second EPI sequences; collecting signals during the RF excitation process of each of the plurality of second EPI sequences; and taking the signals collected during the RF excitation processes of the plurality of second EPI sequences as the dynamically-scanned k-space data of the dynamic period.

In an example, the dynamic scanning parameters may include repetition time, echo time, echo spacing, a field of view, a spatial resolution, and the like. Further, values of the dynamic scanning parameters can be the same as values of the pre-scanning parameters.

The sampling trajectory of the dynamically-scanned k-space of each dynamic period can be the same as the sampling trajectory of the k-space of one or more excitations in the plurality of excitations of the pre-scan.

In an example of the present disclosure, the sampling trajectory of each dynamic period can be the same as the sampling trajectory of one or more excitations of the pre-scan, and the data of the residual k-space and the residual image are to be calculated subsequently. The same sampling trajectories can ensure consistency of the pre-scan and dynamic images in distortion and energy so that the residual image can be obtained; otherwise, the reconstructed residual image is not a real residual image, and may include some common information.

In an example, the sampling trajectory of each dynamic period may be the same as the sampling trajectory during each RF excitation process. In addition, the sampling trajectory of each dynamic period may not overlap with each other. Descriptions will be made below with examples.

Assuming that the first EPI sequence is a four-excitation EPI sequence, the sampling trajectories for collecting different excitation processes are first, second, third and fourth sampling trajectories. Correspondingly, the second EPI sequence is also the four-excitation EPI sequence, and the sampling trajectories of different excitation processes of the dynamic scan may be as follows:

in a first excitation process, signals are collected through the multi-channel coil according to the first sampling trajectory, and the signals obtained in the first excitation process are taken as dynamically-scanned k-space data of a first dynamic period;

in a second excitation process, signals are collected through the multi-channel coil according to the second sampling trajectory, and the signals collected in the second excitation process are taken as dynamically-scanned k-space data of a second dynamic period;

in a third excitation process, signals are collected through the multi-channel coil according to the third sampling trajectory, and the signals collected in the third excitation process are taken as dynamically-scanned k-space data of a third dynamic period; and in a fourth excitation process, signals are collected through the multi-channel coil according to the fourth sampling trajectory, and the signals collected in the fourth excitation process are taken as dynamically-scanned k-space data of a fourth dynamic period.

If the dynamic scan includes more than four dynamic periods, for example, eight dynamic periods, collection may be performed by the same method. For example, in a fifth excitation process, signals are collected through the multi-channel coil according to the first sampling trajectory, and the signals collected in the fifth excitation process are taken as dynamically-scanned k-space data of a fifth dynamic period, and so on.

The dynamically-scanned k-space of each dynamic period may also not be limited to the above forms at step S202. For example, the dynamically-scanned k-spaces of the first to fourth dynamic periods may correspond to the first, third, second and fourth sampling trajectories of the pre-scan.

In another example, the sampling trajectory of each dynamic period may also be same as the sampling trajectories during a plurality of RF excitation processes. A number of RF excitations used in a dynamic period can be less than a number of RF excitations used in the first EPI sequence.

Assuming that the first EPI sequence is a four-excitation EPI sequence, the sampling trajectories for collecting different excitation processes are the first, second, third and fourth sampling trajectories. Correspondingly, the second EPI sequence is also a four-excitation EPI sequence, and the sampling trajectories of different excitation processes of the dynamic scan may be as follows:

in first and second excitation processes, signals are collected through the multi-channel coil according to the first and second sampling trajectories respectively, and the signals collected in the first and second excitation processes are taken as dynamically-scanned k-space data of a first dynamic period; and in third and fourth excitation processes, signals are collected through the multi-channel coil according to the third and fourth sampling trajectories respectively, and the signals collected in the third and fourth excitation processes are taken as dynamically-scanned k-space data of a second dynamic period.

In still another example, the second EPI sequence is a four-excitation EPI sequence, e.g., an EPI sequence from the first excitation to the fourth excitation. As shown in FIG. 3, when the sampling trajectory of each excitation process is a segmented collection in the direction of k-space readout gradient, as an example, step S202 may be performed in the following manner to facilitate obtaining the dynamically-scanned k-space of each dynamic period.

Four excitations are performed for the subject based on the second EPI sequence and the dynamic scanning parameters. In a first excitation process, signals corresponding to the first segment S1 in the direction of k-space readout gradient are collected through the multi-channel coil, and the collected signals associated with the first segment S1 are taken as the dynamically-scanned k-space data of a first dynamic period.

In a second excitation process, signals corresponding to the second segment S2 in the direction of k-space readout gradient are collected through the multi-channel coil, and the collected signals associated with the second segment S2 are taken as the dynamically-scanned k-space data of a second dynamic period.

In a third excitation process, signals corresponding to the third segment S3 in the direction of k-space readout gradient are collected through the multi-channel coil, and the collected signals associated with the third segment S3 are taken as the dynamically-scanned k-space data of a third dynamic period.

In a fourth excitation process, signals corresponding to the fourth segment S4 in the direction of k-space readout gradient are collected through the multi-channel coil, and the collected signals associated with the fourth segment S4 are taken as the dynamically-scanned k-space data of a fourth dynamic period.

In the above given conditions, when the sampling trajectory of each dynamic period is cross phase encoding lines in the direction of k-space phase encoding, as yet another example, step S202 may be performed in the following manner to facilitate obtaining the dynamically-scanned k-space of each dynamic period.

Four excitations are performed for the subject based on the second EPI sequence and the dynamic scanning parameters. In a first excitation process, signals on the 1st, 5th, 9th, . . . , and 4n+1-th rows of phase encoding lines in the k-space are collected through the multi-channel coil, and the collected signals on the 1st, 5th, 9th, . . . , and 4n+1-th rows of phase encoding lines are taken as the dynamically-scanned k-space data of a first dynamic period.

In a second excitation process, signals on the 2nd, 6th, 10th, . . . , and 4n+2-th rows of phase encoding lines are collected through the multi-channel coil, and the collected signals on the 2nd, 6th, 10th, . . . , and 4n+2-th rows of phase encoding lines are taken as the dynamically-scanned k-space data of a second dynamic period.

In a third excitation process, signals on the 3rd, 7th, 11th, . . . , and 4n+3-th rows of phase encoding lines are collected through the multi-channel coil, and the collected signals on the 3rd, 7th, 11th, . . . , and 4n+3-th rows of phase encoding lines are taken as the dynamically-scanned k-space data of a third dynamic period.

In a fourth excitation process, signals on the 4th, 8th, 12th, . . . , and 4n+4-th rows of phase encoding lines are collected through the multi-channel coil, and the collected signals on the 4th, 8th, 12th, . . . , and 4n+4-th rows of phase encoding lines are taken as the dynamically-scanned k-space data of a fourth dynamic period, where n is an integer.

It is to be noted that, during the dynamic scanning process, the sampling trajectory of each excitation process is not limited to the sampling trajectory of the above examples, and therefore may be other forms of sampling trajectory, as long as the sampling trajectory of each excitation process is same as the sampling trajectory of one or more excitation of the pre-scan.

At step S203, a pre-scanned image and second pre-scanned k-space data are obtained according to the first pre-scanned k-space data.

As an example, to increase an imaging speed and simplify algorithm complexity, step S203 may include the following sub-steps.

At a first sub-step, the pre-scanned image is obtained by performing image reconstruction for the first pre-scanned k-space data.

The first pre-scanned k-space data can be multi-channel k-space data obtained by a plurality of excitations. When the plurality of excitations are performed based on an EPI sequence, image amplitude values corresponding to data obtained through different excitations can be the same, and image phase values can be different. Thus, a magnetic resonance image directly obtained through Fourier Transform has artifacts. To improve image quality and increase imaging speed, a pre-scanned image may be obtained by performing image reconstruction for the first pre-scanned k-space data based on a multiplexed sensitivity-encoding (MUSE) algorithm. In addition, if the first pre-scanned k-space data is k-space data obtained with a uniform down-sampling manner, the pre-scanned image may be obtained by performing image reconstruction for the first pre-scanned k-space data based on a generalized auto-calibrating partially parallel acquisition (GRAPPA) algorithm. Thus, the artifacts are removed from the obtained pre-scanned image.

Since the first pre-scanned k-space data is signals obtained by performing at least one pre-scan based on a multi-excitation EPI sequence, the pre-scanned imaged obtained by reconstructing the first pre-scanned k-space data has high image quality.

At a second sub-step, the second pre-scanned k-space data is obtained by mapping the pre-scanned image to the k-space.

At the second sub-step, mapping the pre-scanned image to the k-space by using Fourier Transform may generate the second pre-scanned k-space data. The second pre-scanned k-space data obtained by the mapping is complete multi-channel k-space data.

Since the second pre-scanned k-space data is obtained by mapping the pre-scanned image without artifacts, it may be considered that phases of an image corresponding to the second pre-scanned k-space data is more accurate than phases of an image corresponding to the first pre-scanned k-space data. Therefore, the second pre-scanned k-space data can be used in subsequent residual processing.

In the above example, for each channel of the multi-channel coil, a to-be-processed image of the channel is obtained by multiplying the pre-scanned image by a coil sensitivity map of the channel in an image domain, and then performing inverse Fourier Transform for the to-be-processed image of the channel to obtain the second pre-scanned k-space data of the channel.

In another example, the second pre-scanned k-space data may also be obtained in a data domain. In this example, the step S203 may include the following sub-steps.

At a first sub-step, the pre-scanned image is obtained by performing image reconstruction for the first pre-scanned k-space data. Specific implementation of the first sub-step same as that of the foregoing first sub-step, which will not be described here for simplicity.

At a second sub-step, the second pre-scanned k-space data is obtained by processing the first pre-scanned k-space data. Since the image corresponding to the first pre-scanned k-space data has artifacts, the second pre-scanned k-space data may be obtained by processing the first pre-scanned k-space data with a data interpolation method.

At step S204, for each dynamic period, a residual image of the dynamic period is generated according to the dynamically-scanned k-space data of the dynamic period and the second pre-scanned k-space data.

In an example of the present disclosure, the pre-scanned image obtained in step S203 is an image with a high signal-to-noise ratio, and the pre-scanned image has high similarity with the dynamic image of each dynamic period. Therefore, the residual image between the pre-scanned image and the dynamic image is sparse. To improve the image quality of each dynamic image, the pre-scanned image may be used as a constraint term during reconstruction of the dynamic image.

In an example of the present disclosure, step S204 may include the following sub-steps.

At a first sup-step, residual k-space data of the dynamic period is obtained by performing subtraction for the dynamically-scanned k-space data of the dynamic period and the second pre-scanned k-space data.

It is to be noted that, in an example of the present disclosure, performing subtraction for the dynamically-scanned k-space data of the dynamic period and the second pre-scanned k-space data specifically includes: subtraction is performed for data in the same coil channels and in the same k-space positions. For example, data of the first row of phase encoding line in the second pre-scanned k-space associated with the first channel is subtracted from data of the first row of phase encoding line in the dynamically-scanned k-space of the dynamic period associated with the first channel.

In addition, the first sub-step is required to be performed for each dynamic period. In this case, if there are T (T is a positive integer) dynamic periods in total, T pieces of residual k-space data are obtained by performing this sub-step T times. Each piece of residual k-space data is multi-channel k-space data, and each channel k-space data is in a matrix form.

To understand the first sub-step more clearly, the first sub-step can be represented by formula (1) as follows:

$$rk_j^t = k_j^t - k_j^o \qquad (1),$$

where, $rk_j^t$ refers to residual k-space data of the t-th dynamic period associated with the j-th channel, t is a positive integer, and $t \in \{1, 2, \ldots, T\}$; $k_j^t$ refers to dynamically-scanned k-space data of the t-th dynamic period associated with the j-th channel; $k_j^o$ refers to second pre-scanned k-space data associated with the j-th channel.

Thus, the residual k-space data of each dynamic period may be obtained based on formula (1).

The residual image of the dynamic period may be obtained according to the residual k-space data of the dynamic period.

The first sub-step may specifically include: obtaining the residual image of the dynamic period by performing sparsity constraint reconstruction for the residual k-space data of the dynamic period. The sparsity constraint reconstruction can be a parallel reconstruction manner of sparsity constraint.

In an example, to improve quality of each dynamic image finally reconstructed, the first sub-step may include: solving a corresponding residual image of the dynamic period when a following target function reaches a minimum value, and taking the solved residual image as the residual image of the dynamic period. The target function can be expressed in formula (2):

$$f(rI_t) = \sum_{j=1}^{J} \|E(rI_t) - rk_j^t\|^2 + \alpha \|rI_t\|^2, \qquad (2)$$

where, $f(rI_t)$ refers to the target function of the t-th dynamic period, and t is a positive integer; J refers to a channel number of the multi-channel coil and J is a positive integer; j is a positive integer and $j \in \{1, 2, \ldots, J\}$; $rI_t$ refers to a to-be-solved residual image of the t-th dynamic period, $E(rI_t)$ refers to k-space data corresponding to the to-be-solved residual image $rI_t$ of the t-th dynamic period; $rk_j^t$ refers to residual k-space data of the t-th dynamic period associated with the j-th channel, which is obtained through calculation based on the formula (1); $\| \|^2$ refers to an L2 norm; and a is a regularization factor.

In the above example, the residual image is reconstructed by a parallel reconstruction method. Moreover, the residual image may also be reconstructed by using similarity of data of adjacent dynamic periods. Thus, in another example of the present disclosure, the first sub-step may also include: reconstructing the residual image of the dynamic period by using the similarity of signals of the adjacent dynamic periods in combination with the residual k-space data of the adjacent dynamic periods. More specifically, the first sub-step may include: reconstructing the residual image of the dynamic period in a manner of direct data sharing or k-t parallel reconstruction by using the similarity of signals of the adjacent dynamic periods in combination with the residual k-space data of the adjacent dynamic periods.

It is to be noted that, in an example of the present disclosure, the adjacent dynamic periods may include one or more dynamic periods respectively before and after the current dynamic period.

A specific implementation of reconstructing the residual image of each dynamic period respectively in the manner of direct data sharing or the k-t parallel reconstruction by using the similarity of signals of the adjacent dynamic periods in combination with the residual k-space data of the adjacent dynamic periods will be described below with the adjacent dynamic periods being two dynamic periods respectively before and after the current dynamic period as an example.

For example, if the dynamic image of the t-th dynamic period is to be reconstructed, the residual image of the t-th dynamic period can be reconstructed through k-space interpolation in a manner of direct data sharing or k-t GRAPPA parallel reconstruction by using the residual k-space data $rk_j^{t-1}$ and $rk_j^{t+1}$ of two dynamic periods respectively before and after the t-th dynamic period, that is, the t−1-th dynamic period and the t+1-th dynamic period. The direct data sharing manner refers to that the data in multiple dynamic images of dynamic periods are directly combined as data in a dynamic image of a dynamic period.

At step S205, for each dynamic period, the dynamic image of the dynamic period is obtained by adding the residual image of the dynamic period and the pre-scanned image.

To understand the step more clearly, step S205 can be described by formula (3) as follows:

$$I^t = rI^t + I^o \qquad (3),$$

where, $I^t$ refers to the dynamic image of the t-th dynamic period, that is, a final reconstruction result, and $t \in \{1, 2, \ldots, T\}$; $rI^t$ refers to the residual image of the t-th dynamic period, which is obtained at step S204; and $I^o$ refers to the pre-scanned image, which is obtained at step S203.

The above descriptions are the specific implementation of the dynamic scanning method based on an EPI sequence according to an example of the present disclosure. In the specific implementation, the dynamic image of each dynamic period is obtained by adding the pre-scanned image and the residual image of each dynamic period respectively. The pre-scanned image is obtained by reconstructing the multi-excitation data obtained through at least one pre-scan. The image obtained by reconstructing the multi-excitation data has high image quality, for example, a high image resolution and/or a high image signal-to-noise ratio. Further, the residual image is a sparse image obtained by performing parallel reconstruction with the pre-scanned k-space data as a constraint term. Therefore, the sparse image has a better image reconstruction result, such as fewer artifacts. Thus, the total dynamic image obtained by adding the high-quality pre-scanned image and the residual image of each dynamic period also has high image quality. In addition, the dynamically-scanned k-space data of each dynamic period is data obtained through at least one excitation. Therefore, the collection of the dynamically-scanned k-space for each dynamic period is equivalent to a collection with a high parallel imaging factor (a high down-sampling multiple). In this case, each dynamic image has a small distortion. Further, according to the present disclosure, the data obtained through one excitation is taken as the dynamically-scanned k-space data of one dynamic period, but in a traditional single excitation method, multiple collections of the k-space data and averaging are required. In this case, the scanning time of each dynamic period may be further shortened compared with the traditional single excitation method. Therefore, implementations of the present disclosure can realize effects of increasing the image signal-to-noise ratio and reducing the image distortion without prolonging the scanning time.

Further, according to the method, it is not required to upgrade the configurations of the RF receiving coil and the RF amplifier, and the hardware requirement is not increased. In addition, in this method, the signal loss of the dynamic scan is reduced by using the pre-scanned k-space data. Therefore, the decrease of the image sharpness is reduced.

Further, the method may be widely applied and thus may be applied to various applications, such as functional magnetic resonance imaging (fMRI) and arterial spin labeling (ASL), which use EPI sequences as dynamic scanning sequences. Moreover, the sampling trajectory is not limited in this method, and the signal collection during each RF excitation process of a plurality of excitations in the pre-scan may be performed by using any form of sampling trajectory. For example, a multi-segment sampling trajectory in a direction of k-space readout gradient, a cross phase encoding line sampling trajectory in a direction of k-space phase encoding, or a spiral trajectory may be adopted.

Figure 4:
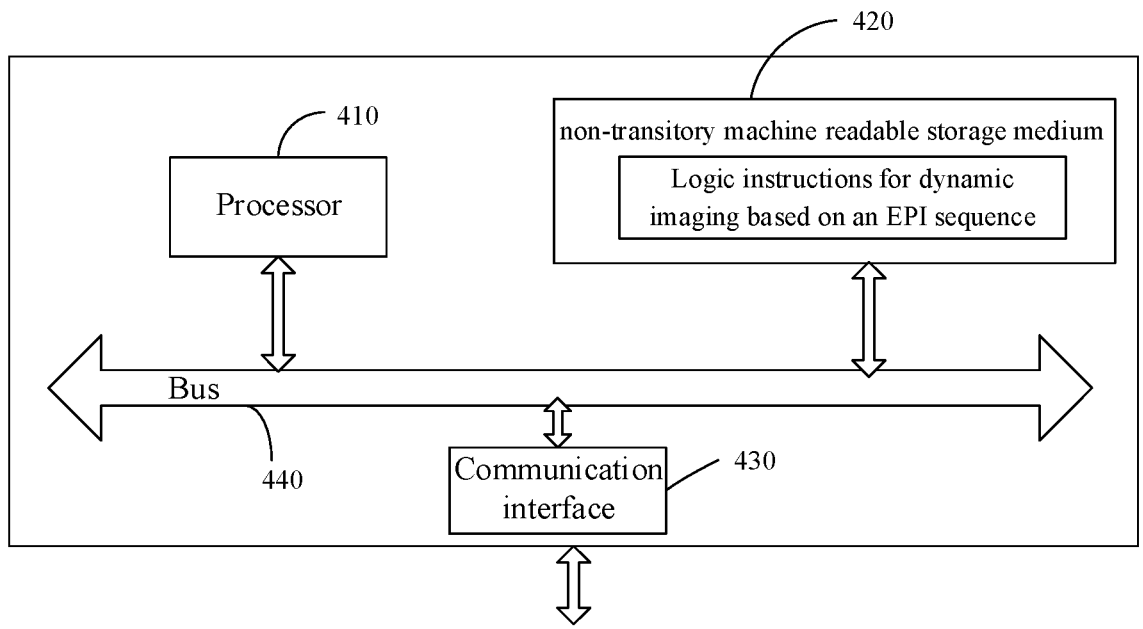
FIG. 4 is a schematic diagram illustrating a structure of a device for executing a dynamic scanning method based on an EPI sequence according to an example of the present disclosure.

The dynamic imaging method based on an EPI sequence according to the above example may be performed by a device shown in FIG. 4. The device includes at least one processor 410 and at least one non-transitory machine readable storage medium 420. And in an example, the device may further include a communication interface 430 and a bus 440. The processor 410, and the non-transitory machine readable storage medium 420 and the communications interface 430 communicate with each other via the bus 440.

The non-transitory machine readable storage medium 420 may store logic instructions for dynamic imaging based on an EPI sequence. The non-transitory machine readable storage medium 420 may be, for example, a non-volatile memory. For example, a flash memory, a storage drive (e.g. hard disk drive), a solid state disk, any type of storage disk (e.g., compact disk, digital video disk), or a similar storage medium, or a combination thereof. The machine readable storage medium 420 may also include different transitory memories such as Random Access Memory (RAM) to cooperate with the non-volatile memory and the processor.

Figure 5:
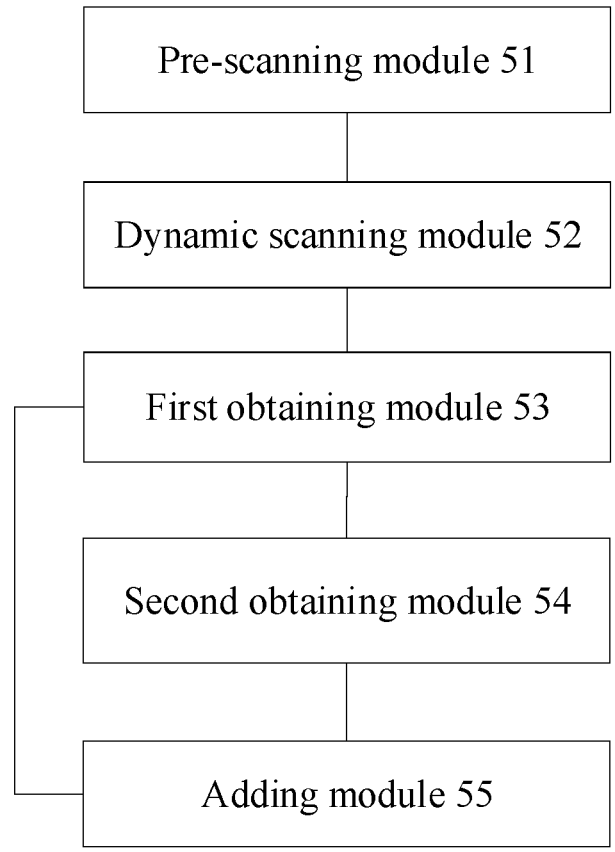
FIG. 5 is a schematic diagram illustrating function modules of logic instructions for dynamic scanning based on an EPI sequence according to an example of the present disclosure.

The machine readable storage medium 420 stores the logic instructions for dynamic imaging based on an EPI sequence. As shown in FIG. 5, logic instructions may include the following modules.

A pre-scanning module 51 is configured to first pre-scanned k-space data by performing at least one pre-scan for a subject based on a first EPI sequence and pre-scanning parameter, where the first EPI sequence includes a plurality of excitations.

A dynamic scanning module 52 is configured to generating dynamically-scanned k-space data associated with each of a plurality of dynamic periods by performing a dynamic scan for the subject based on a second EPI sequence and dynamic scanning parameters, where the dynamically-scanned k-space data of each dynamic period is multi-channel down-sampled k-space data obtained through at least one excitation, the pre-scanning parameters are same as the dynamic scanning parameters, and a sampling trajectory of the dynamically-scanned k-space data of each dynamic period is same as a sampling trajectory of the at least one excitation in the first pre-scan k-space data.

A first obtaining module 53 is configured to obtain a pre-scanned image and second pre-scanned k-space data according to the first pre-scanned k-space data.

A second obtaining module 54 is configured to, for each dynamic period, generate a residual image of the dynamic period according to the dynamically-scanned k-space data of the dynamic period and the second pre-scanned k-space data.

An adding module 55 is configured to, for each dynamic period, obtain a dynamic image of the dynamic period by adding the pre-scanned image and the residual image of the dynamic period.

A software implementation is taken as an example below to further describe how the device for dynamic imaging based on an EPI sequence executes the logic instruction. In this example, the logic instructions should be understood as a machine executable instruction stored in the machine readable storage medium 420. When a processor 410 of the device in the present disclosure executes the logic instructions, the processor 410 performs the following operations by invoking the logic instruction stored in the machine readable storage medium 420.

First pre-scanned k-space data is obtained by performing at least one pre-scan for a subject based on a first EPI sequence and pre-scanning parameter, where the first EPI sequence includes a plurality of excitations.

Dynamically-scanned k-space data associated with each of a plurality of dynamic periods is generated by performing a dynamic scan for the subject based on a second EPI sequence and dynamic scanning parameters, where the dynamically-scanned k-space data of each dynamic period is multi-channel down-sampled k-space data obtained through at least one excitation, the pre-scanning parameters are same as the dynamic scanning parameters, and a sampling trajectory of the dynamically-scanned k-space data of each dynamic period is same as a sampling trajectory of the at least one excitation in the first pre-scan k-space data.

A pre-scanned image and second pre-scanned k-space data are obtained according to the first pre-scanned k-space data.

For each dynamic period, a residual image of the dynamic period is generated according to the dynamically-scanned k-space data of the dynamic period and the second pre-scanned k-space data.

For each dynamic period, a dynamic image of the dynamic period is obtained by adding the pre-scanned image and the residual image of the dynamic period.

In an example, generating the residual image of the dynamic period according to the dynamically-scanned k-space data of the dynamic period and the second pre-scanned k-space data includes: obtaining residual k-space data of the dynamic period by performing subtraction for the dynamically-scanned k-space data of the dynamic period and the second pre-scanned k-space data; and generating the residual image of the dynamic period according to the residual k-space data of the dynamic period.

In an example, generating the residual image of the dynamic period according to the residual k-space data of the dynamic period includes: generating the residual image of the dynamic period by performing sparsity constraint reconstruction for the residual k-space data of the dynamic period in combination with a parallel reconstruction manner of sparsity constraint.

In an example, generating the residual image of the dynamic period by performing sparsity constraint reconstruction for the residual k-space data of the dynamic period in combination with the parallel reconstruction manner of the sparsity constraint includes: solving a corresponding residual image when a following target function reaches a minimum value, and taking the solved residual image as the residual image of the dynamic period, where the target function is described in formula (2).

In an example, generating the residual image of the dynamic period according to the residual k-space data of the dynamic period includes: reconstructing the residual image of the dynamic period in combination with the residual k-space data of adjacent dynamic periods, where the adjacent dynamic periods are one or more dynamic periods respectively before and after the dynamic period.

In an example, reconstructing the residual image of the dynamic period includes: reconstructing the residual image of the dynamic period in a manner of direct data sharing or k-t generalized auto-calibrating partially parallel acquisition (GRAPPA) parallel reconstruction in combination with the residual k-space data of the adjacent dynamic periods.

In an example, the sampling trajectory of the first pre-scanned k-space data is any of the following: a multi-segment sampling trajectory in a direction of k-space readout gradient; a cross phase encoding line sampling trajectory in a direction of k-space phase encoding; or a spiral trajectory.

In an example, the second EPI sequence and the first EPI sequence are the same EPI sequence, where the dynamically-scanned k-space data of each dynamic period is k-space data collected during each RF excitation process of the plurality of excitations respectively.

In an example, the second EPI sequence and the first EPI sequence are the same EPI sequence. The second EPI sequence can include a plurality of excitations same as the plurality of excitations of the first EPI sequence. The dynamically-scanned k-space data of each of the dynamic periods includes k-space data respectively collected during one or more excitation processes of the plurality of excitations of the second EPI sequence, and a number of the one or more excitation processes for the collected k-space data being smaller than a number of the plurality of excitations. For example, a dynamic scan use the second EPI with four excitation. For each dynamic period in the dynamic scan, only one to three times of excitations may be used to collect k-space data and generate an MR image. For example, the first dynamic period use first and second excitations of the second EPI to collect k-space data (that is half of entire k-space data), the second dynamic period use third and fourth excitations of the second EPI to collect k-space data (that is half of entire k-space data), the third dynamic period use the first and second excitations of the second EPI to collect k-space data (that is half of entire k-space data), the fourth dynamic period use the third and fourth excitations of the second EPI to collect k-space data (that is half of entire k-space data), and so on. The multiple dynamic periods form the dynamic scan.

In an example, the second EPI sequence includes a single excitation in the first EPI sequence.

In an example, obtaining the pre-scanned image and the second pre-scanned k-space data according to the first pre-scanned k-space data includes: generating the pre-scanned image by performing image reconstruction for the first pre-scanned k-space data; and obtaining the second pre-scanned k-space data by mapping the pre-scanned image to a k-space.

In an example, generating the pre-scanned image by performing image reconstruction for the first pre-scanned k-space data includes: generating the pre-scanned image by performing image reconstruction for the first pre-scanned k-space data based on a multiplexed sensitivity-encoding algorithm.

In an example, obtaining the second pre-scanned k-space data by mapping the pre-scanned image to the k-space includes: for each of the multi-channel, obtaining a to-be-processed image of the channel by multiplying the pre-scanned image by a coil sensitivity map of the channel; and obtaining the second pre-scanned k-space data by performing inverse Fourier Transform for the to-be-processed image of each of the multi-channels.

In an example, obtaining the pre-scanned image and the second pre-scanned k-space data according to the first pre-scanned k-space data includes: generating the pre-scanned image by performing image reconstruction for the first pre-scanned k-space data; and obtaining the second pre-scanned k-space data by performing interpolation processing for the first pre-scanned k-space data.

The above descriptions are the specific implementation of the dynamic scanning method based on an EPI sequence according to an example of the present disclosure. In the specific implementation, the dynamic image of each dynamic period is obtained by adding the pre-scanned image and the residual image of each dynamic period respectively. The pre-scanned image is obtained by reconstructing the multi-excitation data obtained through at least one pre-scan. The image obtained by reconstructing the multi-excitation data has high image quality, for example, a high image resolution and/or a high image signal-to-noise ratio. Further, the residual image is a sparse image obtained by performing parallel reconstruction with the pre-scanned k-space data as a constraint term. Therefore, the sparse image has a better image reconstruction result, such as fewer artifacts. Thus, the total dynamic image obtained by adding the high-quality pre-scanned image and the residual image of each dynamic period also has high image quality. In addition, the dynamically-scanned k-space data of each dynamic period is data obtained through at least one excitation. Therefore, the collection of the dynamically-scanned k-space for each dynamic period is equivalent to a collection with a high parallel imaging factor (a high down-sampling multiple). In this case, each dynamic image has a small distortion. Further, according to the present disclosure, the data obtained through one excitation is taken as the dynamically-scanned k-space data of one dynamic period, but in a traditional single excitation method a plurality of collecting the k-space data and averaging is required. In this case, the scanning time of each dynamic period may be further shortened compared with the traditional single excitation method. Therefore, the present disclosure realizes effects of increasing the image signal-to-noise ratio and reducing the image distortion without prolonging the scanning time.

The above are specific examples of the present disclosure.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A dynamic imaging method based on an Echo Planar Imaging (EPI) sequence, comprising:
   obtaining first pre-scanned k-space data by performing at least one pre-scan for a subject based on a first EPI sequence and pre-scanning parameters, wherein the first EPI sequence comprises a plurality of excitations;
   obtaining a pre-scanned image and second pre-scanned k-space data according to the first pre-scanned k-space data;
   performing a dynamic scan for the subject based on a second EPI sequence and dynamic scanning parameters to generate dynamically-scanned k-space data associated with each of a plurality of dynamic periods in the dynamic scan, wherein the dynamic scanning parameters are same as the pre-scanning parameters, the dynamically-scanned k-space data of the dynamic period comprises multi-channel down-sampled k-space data obtained through at least one excitation of the dynamic period, and a sampling trajectory of the at least one excitation of the dynamic period is same as a sampling trajectory of at least one excitation of the at least one pre-scan; and
   for each of the plurality of dynamic periods, generating a residual image of the dynamic period according to the dynamically-scanned k-space data of the dynamic period and the second pre-scanned k-space data, and adding the pre-scanned image and the residual image of the dynamic period to obtain a dynamic image of the dynamic period.

2. The method of claim 1, wherein generating a residual image of the dynamic period according to the dynamically-scanned k-space data of the dynamic period and the second pre-scanned k-space data comprises:
   subtracting the second pre-scanned k-space data from the dynamically-scanned k-space data of the dynamic period to obtain residual k-space data of the dynamic period; and
   generating the residual image of the dynamic period according to the residual k-space data of the dynamic period.

3. The method of claim 2, wherein generating the residual image of the dynamic period according to the residual k-space data of the dynamic period comprises:
   generating the residual image of the dynamic period by performing parallel reconstruction of sparsity constraint for the residual k-space data of the dynamic period.

4. The method of claim 3, wherein generating the residual image of the dynamic period by performing parallel reconstruction of sparsity constraint for the residual k-space data of the dynamic period comprises:
   obtaining a corresponding residual image when a target function reaches a minimum value, and taking the corresponding residual image as the residual image of the dynamic period,
   wherein the target function is expressed as below:

$$f(rI_t) = \sum_{j=1}^{J} \|E(rI_t) - rk_j^t\|^2 + \alpha \|rI_t\|^2,$$

where $f(rI_t)$ refers to the target function of the t-th dynamic period, and t is a positive integer;

J refers to a channel number of a coil and is a positive integer;

j is a positive integer and j∈{1, 2, . . . , J};

$rI_t$ refers to a to-be-solved residual image of the t-th dynamic period;

$E(rI_t)$ refers to k-space data corresponding to the to-be-solved residual image $rI_t$ of the t-th dynamic period;

$rk_j^t$ refers to the residual k-space data of the t-th dynamic period associated with the j-th channel;

$\| \|^2$ refers to an L2 norm; and

α is a regularization factor.

5. The method of claim 2, wherein generating the residual image of the dynamic period according to the residual k-space data of the dynamic period comprises:

reconstructing the residual image of the dynamic period by using the residual k-space data of adjacent dynamic periods that comprise one or more dynamic periods respectively before and after the dynamic period.

6. The method of claim 5, wherein reconstructing the residual image of the dynamic period comprises:

reconstructing the residual image of the dynamic period by direct data sharing or k-t generalized auto-calibrating partially parallel acquisition (GRAPPA) parallel reconstruction.

7. The method of claim 1, wherein the sampling trajectory of the at least one excitation of the first EPI sequence comprises one of:

a multi-segment sampling trajectory in a direction of k-space readout gradient, a cross phase encoding line sampling trajectory in a direction of k-space phase encoding, and a spiral trajectory.

8. The method of claim 1, wherein the second EPI sequence are the same as the first EPI sequence and comprises a plurality of excitations same as the plurality of excitations of the first EPI sequence, and wherein the dynamically-scanned k-space data of each of the dynamic periods comprises k-space data respectively collected during each RF excitation process of the plurality of excitations of the second EPI sequence.

9. The method of claim 1, wherein the second EPI sequence are the same as the first EPI sequence and comprises a plurality of excitations same as the plurality of excitations of the first EPI sequence, and wherein the dynamically-scanned k-space data of each of the dynamic periods comprises k-space data respectively collected during one or more excitation processes of the plurality of excitations of the second EPI sequence, a number of the one or more excitation processes for the collected k-space data being smaller than a number of the plurality of excitations.

10. The method of claim 1, wherein the second EPI sequence comprises a single excitation in the first EPI sequence.

11. The method of claim 1, wherein obtaining the pre-scanned image and the second pre-scanned k-space data according to the first pre-scanned k-space data comprises:

generating the pre-scanned image by performing image reconstruction for the first pre-scanned k-space data; and obtaining the second pre-scanned k-space data by mapping the pre-scanned image to a k-space.

12. The method of claim 11, wherein generating the pre-scanned image by performing image reconstruction for the first pre-scanned k-space data comprises:

generating the pre-scanned image by performing image reconstruction for the first pre-scanned k-space data based on a multiplexed sensitivity-encoding algorithm.

13. The method of claim 11, wherein obtaining the second pre-scanned k-space data by mapping the pre-scanned image to the k-space comprises:

for each of multiple channels corresponding to a multi-channel coil, multiplying the pre-scanned image by a coil sensitivity map of the channel to obtain a to-be-processed image of the channel; and obtaining the second pre-scanned k-spaced data by performing inverse Fourier Transform for the to-be-processed images of the multiple channels.

14. The method of claim 1, wherein obtaining the pre-scanned image and the second pre-scanned k-space data according to the first pre-scanned k-space data comprises:

generating the pre-scanned image by performing image reconstruction for the first pre-scanned k-space data; and obtaining the second pre-scanned k-space data by performing interpolation processing for the first pre-scanned k-space data.

15. The method of claim 1, further comprising:

arranging the dynamic images of the plurality of dynamic periods in the dynamic scan along a time dimension to indicate a situation of changes in a component of the subject.

16. A dynamic imaging device based on an Echo Planar Imaging (EPI) sequence, comprising:

at least one processor; and at least one non-transitory machine readable storage medium coupled to the at least one processor having machine-executable instructions stored thereon that, when executed by the at least one processor, cause the at least one processor to perform operations comprising:

obtaining first pre-scanned k-space data by performing at least one pre-scan for a subject based on a first EPI sequence and pre-scanning parameters, wherein the first EPI sequence comprises a plurality of excitations;

obtaining a pre-scanned image and second pre-scanned k-space data according to the first pre-scanned k-space data;

performing a dynamic scan for the subject based on a second EPI sequence and dynamic scanning parameters to generate dynamically-scanned k-space data associated with each of a plurality of dynamic periods in the dynamic scan, wherein the dynamic scanning parameters are same as the pre-scanning parameters, the dynamically-scanned k-space data of the dynamic period comprises multi-channel down-sampled k-space data obtained through at least one excitation of the dynamic period, and a sampling trajectory of the at least one excitation of the dynamic period is same as a sampling trajectory of at least one excitation of the at least one pre-scan; and for each of the plurality of dynamic periods, generating a residual image of the dynamic period according to the dynamically-scanned k-space data of the dynamic period and the second pre-scanned k-space data, and adding the pre-scanned image and the residual image of the dynamic period to obtain a dynamic image of the dynamic period.

17. The dynamic imaging device of claim 16, wherein generating the residual image of the dynamic period according to the dynamically-scanned k-space data of the dynamic period and the second pre-scanned k-space data comprises:

subtracting the second pre-scanned k-space data from the dynamically-scanned k-space data of the dynamic period to obtain residual k-space data of the dynamic period; and generating the residual image of the dynamic period according to the residual k-space data of the dynamic period.

18. The dynamic imaging device of claim 17, wherein generating the residual image of the dynamic period according to the residual k-space data of the dynamic period comprises:

generating the residual image of the dynamic period by performing parallel reconstruction of sparsity constraint for the residual k-space data of the dynamic period.

19. The dynamic imaging device of claim 17, wherein generating the residual image of the dynamic period according to the residual k-space data of the dynamic period comprises:

reconstructing the residual image of the dynamic period by using the residual k-space data of adjacent dynamic periods that comprise one or more dynamic periods respectively before and after the dynamic period.

20. The dynamic imaging device of claim 19, wherein reconstructing the residual image of the dynamic period comprises:

reconstructing the residual image of the dynamic period by direct data sharing or k-t generalized auto-calibrating partially parallel acquisition (GAPPA) parallel reconstruction.

\* \* \* \* \*